(12) United States Patent
Kumagai et al.

(10) Patent No.: US 6,312,840 B1
(45) Date of Patent: Nov. 6, 2001

(54) MAGNETIC TUNNELING ELEMENT AND MANUFACTURING METHOD THEREFOR

(75) Inventors: Seiji Kumagai; Eiji Nakashio; Junichi Sugawara, all of Miyagi; Yoshito Ikeda, Tochigi, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/397,069

(22) Filed: Sep. 16, 1999

(30) Foreign Application Priority Data

Sep. 17, 1998 (JP) .................................................. 10-263696

(51) Int. Cl.$^7$ ....................................................... B32B 19/00

(52) U.S. Cl. ............... 428/692; 428/694 T; 428/694 TS; 428/900; 365/173; 365/171

(58) Field of Search .................................. 365/173, 171; 428/694 T, 694 TS, 692, 900

(56) References Cited

U.S. PATENT DOCUMENTS 5,764,567 * 6/1998 Parkin ................................. 365/173

FOREIGN PATENT DOCUMENTS 0 898 315 A1  2/1999 (EP) .

OTHER PUBLICATIONS

Indo "Influence of Interlayer Roughness on Magnetoresistance Effect,." JMMM 198–199 (1999).*

J.S. Moodera, et al., Ferromagnetic–Insulation–Ferromagnetic Tunneling: Spin–Dependent Tunneling and Large Magnetoresistance in Trilayer Junctions (Invited), Journal of Applied Physics, U.S. American Inst. of Physics, New York, vol. 279, No. 8, Part 02A, Apr. 15, 1996, pp. 4724–4729, XP000695592.

B.G. Park, et al., Dependence of tunneling magnetoresistance on CoFe interfacial layer thickness in NiFe/Al2O3/NiFe tunnel junctions, IEEE Transactions on Magnetics, vol. 35, No. 5, Sep., 1999, pp. 2919–2921, XP002128404.

Y. Indo, et al., Influence of interlayer roughness on magnetoresistance effect of ferromagnetic tunneling junctions, Journal of Magnetism and Magnetic Materials, vol. 198, Jun., 1999, pp. 155–157, XP000874195.

* cited by examiner

Primary Examiner—Leszek Kiliman
(74) Attorney, Agent, or Firm—Sonnenschein, Nath & Rosenthal

(57) ABSTRACT

A magnetic tunnelling element in which the tunnel current flows reliably in an insulating layer to exhibit a stable magnetic tunnelling effect. To this end, the magnetic tunnelling element at least includes a first magnetic layer, a tunnel barrier layer formed on the first magnetic layer and a second magnetic layer formed on the tunnel barrier layer. The tunnel current flows via the tunnel barrier layer between the first magnetic metal layer and the second magnetic metal layer. The surface of the first magnetic layer carrying the tunnel barrier layer has a surface roughness (Ra) of 0.3 nm or less.

19 Claims, 5 Drawing Sheets

MAGNETIC TUNNELING ELEMENT AND MANUFACTURING METHOD THEREFOR

BACKGROUND OF THE INVENTION

1. Field of the Invention

This invention relates to a magnetic tunnelling element in which a pair of magnetic layers are laminated via a tunnel barrier layer and in which the tunnel current is caused to flow from one to the other magnetic layer, with the conductance of the tunnel current being changed in dependence upon the ratio of polarization of magnetization of the paired magnetic layers. This invention also relates to a method for manufacturing the magnetic tunnelling element.

2. Description of the Related Art

It has been reported that, if, in a layered structure comprised of a thin insulating layer sandwiched between a pair of magnetic metal layers, a pre-set voltage is applied across the paired magnetic metal layers as electrodes, a magnetic tunnelling effect is displayed, in which the conductance of the tunnel current flowing in the insulating layer is changed in dependence upon the relative angle of magnetization of the paired magnetic metal layers. That is, a layered structure comprised of a thin insulating layer sandwiched between a pair of magnetic metal layers exhibits a magneto-resistance effect with respect to the tunnel current flowing in the insulating layer.

In this magnetic tunnelling effect, the specific magnetoresistance can be theoretically calculated based on the ratio of polarization of magnetization of the paired magnetic metal layers. In particular, if Fe is used as the material of the paired magnetic metal layers, expectation may be made of the specific magnetoresistance amounting approximately to 40%.

Therefore, a magnetic tunnelling element having a layered structure comprised of a thin insulating layer sandwiched between paired magnetic metal layers is stirring up notice as an element for detecting an external magnetic field.

In the above-described magnetic tunnelling element, a metal oxide is routinely used as the thin insulating layer. However, if a metal oxide is used as an insulating layer, pinholes etc tend to be formed, such that shorting tends to be induced between the paired magnetic metal layers. There are occasions wherein, if a metal oxide is used as an insulating layer, the metal oxidation degree is insufficient, such that the tunnel barrier is incomplete such that the magnetic tunnelling effect is not displayed.

In the conventional magnetic tunnelling element, changes in conductance of the current in dependence upon the relative angle of magnetization of the paired magnetic metal layers, laminated via an insulating layer in-between, that is the magnetic tunnelling effect, were detected. However, with the conventional magnetic tunnelling element, it is difficult to demonstrate the magnetic tunnelling effect reliably such that the conventional magnetic tunnelling element cannot be used for practical application.

SUMMARY OF THE INVENTION

It is therefore an object of the present invention to provide a magnetic tunnelling element in which the tunnel current flows positively in the insulating layer to exhibit the magnetic tunnelling effect in stability.

In one aspect, the present invention provides a magnetic tunnelling element including a first magnetic layer, a tunnel barrier layer formed on the first magnetic layer; and a second magnetic layer formed on the tunnel barrier layer formed on the tunnel barrier layer, the tunnel current flowing between the first magnetic layer and the second magnetic layer via the tunnel barrier layer. The surface of the first magnetic layer carrying the tunnel barrier layer has a surface roughness (Ra) of 0.3 nm or less.

With the magnetic tunnelling element according to the present invention, as described above, since the surface of the first magnetic metal layer carrying the tunnel barrier layer has an average surface roughness (Ra) of 0.3 nm or less, the tunnel barrier layer 2 has its surface planarized to a high degree, so that, with the present magnetic tunnelling element, the interface between the first magnetic metal layer and the tunnel barrier layer and that between the second magnetic metal layer and the tunnel barrier layer are in optimum states to display the magnetic tunnelling effect reliably.

In another aspect, the present invention provides a method for manufacturing a magnetic tunnelling element at least including a first magnetic metal layer, a tunnel barrier layer and a second magnetic metal layer, laminated together, in which the method includes the steps of forming the first magnetic layer so that its major surface will have an average roughness (Ra) of 0.3 nm or less, forming the tunnel barrier layer on the major surface of the first magnetic metal layer and forming the second magnetic metal layer on the tunnel barrier layer.

With the manufacturing method for the magnetic tunnelling element according to the present invention, since the first magnetic metal layer is formed so that its major surface will be of the average surface roughness (RA) of 0.3 nm or less, the tunnel barrier layer formed on this major surface can be of optimum surface properties. Therefore, with this technique, the first magnetic metal layer and the tunnel barrier layer can be formed to optimum states.

In particular, with the magnetic tunnelling element according to the present invention, the surface roughness (Ra) of the surface of the first magnetic metal layer carrying the tunnel barrier layer is 0.3 nm or less. Thus, with the present magnetic tunnelling element, the tunnel current is allowed to flow positively between the first magnetic metal layer and the second magnetic metal layer in the vicinity of the tunnel barrier layer. Therefore, the magnetic tunnelling element of the present invention positively exhibits the high magnetic tunnelling effect.

Also, with the present manufacturing method for the magnetic tunnelling element, the first magnetic metal layer is formed so that its major surface will have an average roughness (Ra) of 0.3 nm or less. Thus, with the present technique, the magnetic tunnelling element can be provided which allows the current to flow reliably between the first magnetic metal layer and the second magnetic metal layer in the vicinity of the tunnel barrier layer. Therefore, with the present manufacturing method for the magnetic tunnelling element, a magnetic tunnelling element exhibiting a high magnetic tunnelling effect can be manufactured reliably.

Since the high magnetic tunnelling effect can be realized in the present invention, the present invention can be applied with advantage to a high output magnetic head.

DESCRIPTION OF THE PREFERRED EMBODIMENTS

Figure 1:
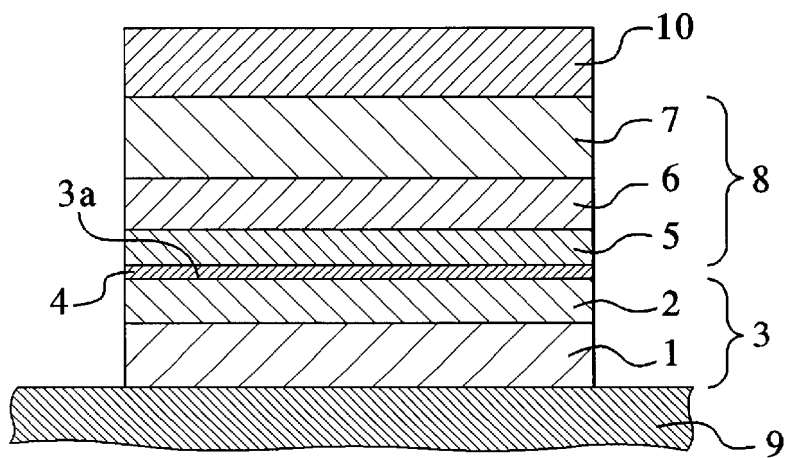
FIG. 1 is a cross-sectional view showing essential parts of a magnetic tunnelling element according to the present invention.

Referring to the drawings, preferred embodiments of a magnetic tunnelling element and a manufacturing method therefor according to the present invention will be explained in detail.

A magnetic tunnelling element, embodying the present invention, is made up of a first magnetic metal layer 3, having a NiFe layer 1 and a Co layer 2, a tunnel barrier layer 4 formed for overlying the first magnetic metal layer 3, and a second magnetic metal layer 8, having a Co layer 5, NiFe layer 6 and a FeMn layer 7.

The magnetic tunneling element is formed on a P-type Si substrate 9, on the surface of which has been formed an oxide layer approximately 300 nm in thickness by thermal oxidation. The present magnetic tunnelling element also has a Ta layer 10 on the FeMn layer 7 to prohibit corrosion of the FeMn layer 7. In one embodiment, the Ta layer 10 layer is formed to a thickness of approximately 20 nm.

Specifically, the respective layers of the present magnetic tunnelling element were formed under sputtering conditions shown in Table 1. It is noted, however, that the magnetic tunnelling element and the manufacturing method therefor according to the present invention are not limited to these sputtering conditions.

Figure 2:
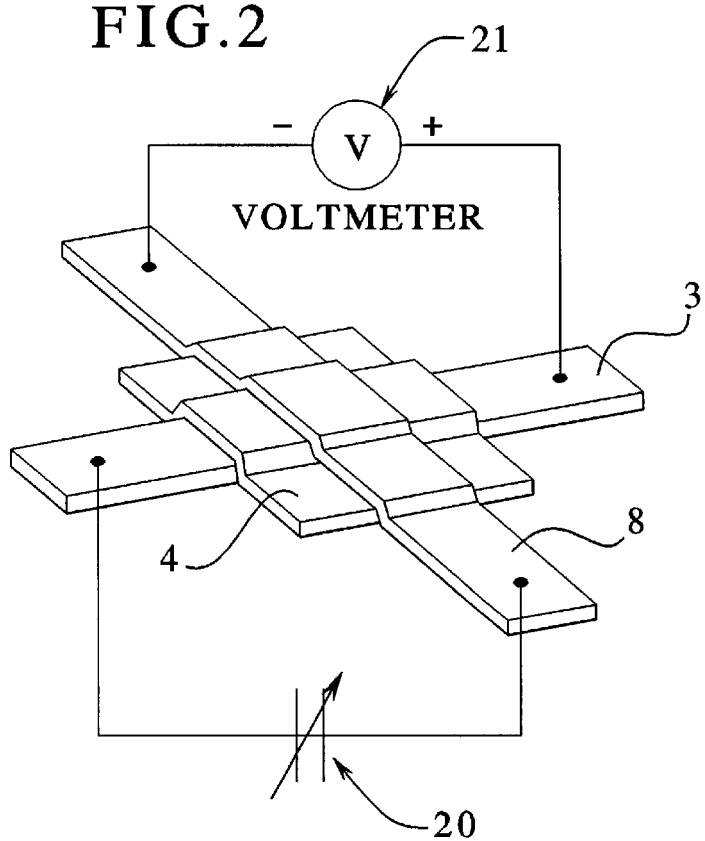
FIG. 2 is a perspective view showing essential portions of the connection between the magnetic tunnelling element, constant current source and the voltmeter.

8, each in a strip shape, are formed for crossing each other, as shown in FIG. 2. In this magnetic tunnelling element, the tunnel barrier layer 4 are formed for covering at least the crossing region of the first magnetic metal layer 3 and the second magnetic metal layer 8. In the present magnetic tunnelling element, the vicinity of the end of the first magnetic metal layer 3 and the vicinity of the end of the second magnetic metal layer 8 are formed on the P-type Si substrate 9. However, since an oxide layer is formed on the surface of the P-type Si substrate 9, there is no risk of shorting of the first magnetic metal layer 3 and the second magnetic metal layer 8.

Also, in the present magnetic tunnelling element, the NiFe layer 1 of the first magnetic metal layer 3 has been subjected to uniaxial orientation processing in a predetermined direction so that it proves a free magnetization film the direction of magnetization of which is changed by the external magnetic field. On the other hand, the NiFe layer 6 othe second magnetic metal layer 8 is exchange-coupled to the FeMn layer 7 so that it proves a fixed magnetization film having a fixed magnetization in a predetermined direction. Thus, if a predetermined external magnetic field is applied to the present magnetic tunnelling element, the magnetization of the NiFe layer 1 is changed responsive to the external magnetic field. Thus, as a result of application of the external magnetic field, the magnetization of the NiFe layer 1 has a predetermined angle with respect to that of the NiFe layer 7 of the second magnetic metal layer 8.

With the present magnetic tunnelling element, a constant current source 20 is connected to an end of the magnetic metal layer 3 and to an end of the magnetic metal layer 8, while a voltmeter 21 is mounted on the other end of the first magnetic metal layer 3 and on the other end of the magnetic layer 8, as shown in FIG. 2.

In the above-described magnetic tunnelling element, the tunnel current which traverses the tunnel barrier layer flows between the first magnetic metal layer 3 and the magnetic metal layer 8, by a constant current furnished from the constant current source 20. If, in this magnetic tunnelling element, a predetermined external magnetic field is applied,

TABLE 1

| target | Ni—Fe | Co | Al | Fe—Mn | Ta |
|---|---|---|---|---|---|
| discharging type | DC | DC | RF | RF | RF |
| Ar gas flow rate | 40 sccm | 40 sccm | 40 sccm | 40 sccm | 40 sccm |
| vacuum degree reached (Pa) | $4 \times 10^{-5}$ or less | $4 \times 10^{-5}$ or less | $4 \times 10^{-5}$ or less | $4 \times 10^{-5}$ or less | $4 \times 10^{-5}$ or less |
| sputtering gas pressure (Pa) | 0.36 | 0.36 | 0.36 | 0.36 | 0.36 |
| Discharging current (A) or Making power (W) | 0.8 A | 0.8 A | 100 W | 200 W | 200 W |
| film-forming speed (Å) | 2.4 | 2 | 0.55 | 12.1 | 1.28 |

In the present magnetic tunnelling element, the tunnel barrier layer was formed by forming an A1 layer and substantially oxidizing this A1 film. The oxidizing conditions are shown in the following Table 2.

TABLE 2

| Ar gas flow rate | 30 sccm |
|---|---|
| oxygen gas flow rate (sccm) | 15 sccm |
| sputtering gas pressure | 0.3 Pa |
| discharging type | RF back sputtering |
| making power (W) | 20 W |
| oxidation time (sec) | 2000 sec |

In the present magnetic tunnelling element, the first magnetic metal layer 3 and the second magnetic metal layer the direction of magnetization of the NiFe layer 1 is at a predetermined angle with respect to that of the NiFe layer 7.

With the present magnetic tunnelling element, the resistance value to the tunnel current is changed depending on the relative angle between the direction of magnetization of the NiFe layer 1 and that of the NiFe layer 7. Thus, if the constant current is supplied from the constant current source 20, the change in the resistance value to the tunnel current is represented as changes in voltage, so that, in the present magnetic tunnelling element, the external magnetic field can be detected by detecting voltage changes of the constant furnished current.

The magnetic tunnelling element can be used for a variety of magnetic devices, such as, for example, a magnetic head, a magnetic sensor or a magnetic memory.

Also, in the present magnetic tunnelling element, the Co layer 2 of the first magnetic metal layer 3 and the Co layer 5 of the second magnetic metal layer 8 are higher in the ratio of spin polarization than the NiFe layer 1 or the NiFe layer 6 and hence serve for achieving a higher specific magnetoresistance. That is, by arranging the Co layer 2 and the Co layer 5 on an interface between the NiFe layer 1 and the tunnel barrier layer 4 and on an interface between the NiFe layer 6 and the tunnel barrier layer 4, it is possible to increase the specific magnetoresistance of the magnetic tunnelling element.

In particular, in the present magnetic tunnelling element, the average roughness (Ra) of the major surface 3a of the first magnetic metal layer 3, stated differently, the surface of the Co layer 2, is set to 0.3 nm or less. Thus, with the present magnetic tunnelling element, the tunnel barrier layer 4 is formed on the Co layer 2 having the average roughness (Ra) not higher than 0.3 nm. Therefore, the tunnel barrier layer 4 has a substantially planar interface to the Co layer 2, while having a planar major surface.

Also, in the present magnetic tunnelling element, the second magnetic metal layer 8 is formed on the tunnel barrier layer 4, having a planar major surface, the interface between the tunnel barrier layer 4 and the second magnetic metal layer 8 is also planar.

Figure 3:
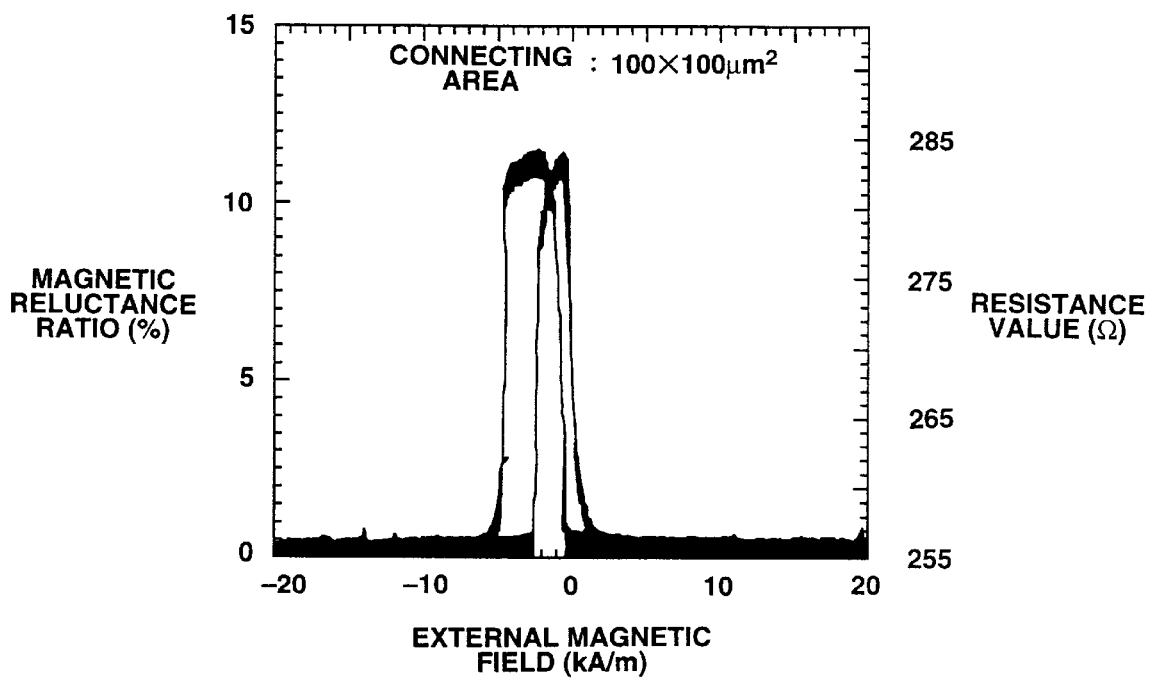
FIG. 3 is a graph showing the relation between the external magnetic field and the specific magnetoresistence.

Therefore, if, with the present magnetic tunnelling element, an external magnetic field is applied, as described above, the direction of magnetization can be positively changed, in dependence upon this external magnetic field, in the vicinity of the interface to the tunnel barrier layer 4 of the NiFe layer 1. Thus, with the present magnetic tunnelling element, the direction of magnetization of the NiFe layer 1 makes a predetermined angle with that of the NiFe layer 7, depending on the external magnetic field, in the vicinity of the interface to the tunnel barrier layer 4. The result is that, with the present magnetic tunnelling element, the magnetic tunnelling effect is positively displayed in dependence upon the external magnetic field, as shown in FIG. 3. It is noted that, in FIG. 3, measurement was made in the external magnetic field of approximately ±24 kA/m (300 Oe). Also, as may be seen from FIG. 3, the magnetic field of exchange coupling is 3.3 kA/m (approximately 41.25 Oe), with the resistance value and the specific magnetoresistance of the element being 25Ω and approximately 15%, respectively.

An experiment for investigating into the relation between the average roughness (Ra) and the specific magnetoresistance is now explained. In the following explanation, the average roughness (Ra) of the surface of the first magnetic metal layer 3 has been measured using an atomic force microscope.

Figure 4:
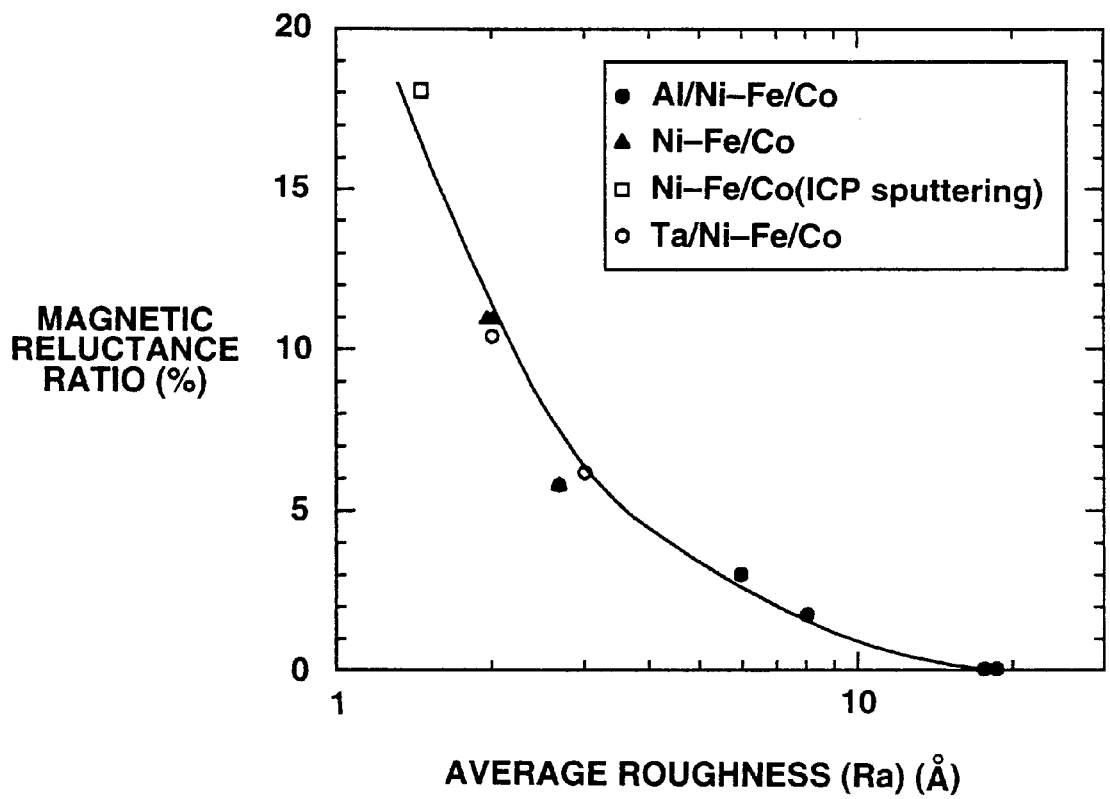
FIG. 4 is a graph showing the relation between the average roughness (Ra) and the specific magnetoresistance on the surface of the first magnetic metal layer.

In the present experiment, such a magnetic tunnelling element was used in which an Al layer and a Ta layer have been formed as underlying layers of the first magnetic metal layer and in which the NiFe layer was formed using high frequency induction coupling RF supporting magnetron sputtering, stated in FIG. 4 as ICP sputtering. The results are shown in FIG. 4.

It may be seen from FIG. 4 that the smaller the average roughness of the interface to the tunnel barrier layer, that is the average roughness (Ra) of the Co layer 2, the larger becomes the specific magnetoresistance of the magnetic tunnelling element. As shown in FIG. 4, when the Co layer 2 of the first magnetic metal layer 3 has an average roughness (Ra) of 0.3 nm or less, the specific magnetorsistance of the magnetic tunnelling element is approximately is not less than 5%.

In a magnetic tunnelling element, the NiFe layer of which has been formed by the high frequency induction coupling RF supporting magnetron sputtering, the average roughness (Ra) of the Co layer could be set to 0.15 nm, thus achieving a specific magnetoresistance as high as 18%.

Meanwhile, measurement was made of the relation between the thickness of the first magnetic layer 3 and/or the underlying layer and the average roughness (Ra) of the Co layer for the case where an underlying layer is not provided for the first magnetic metal layer 3, for the case where an Al underlying layer is provided for the first magnetic metal layer 3 and for the case where a Ta underlying layer is provided for the first magnetic metal layer 3. It is noted that, if no underlying layer is provided for the first magnetic layer 3, the entire film thickness was changed by changing the thickness of the Co layer 2 with the thickness of the NiFe layer 1 remaining unchanged (18.8 nm). If there is provided the Al underlying layer or the Ta underlying layer, the entire thickness was changed by changing the thickness of the Al underlying layer or the Ta underlying layer, with the thickness of the NiFe layer 1 remaining unchanged (18.8 nm).

Figure 5:
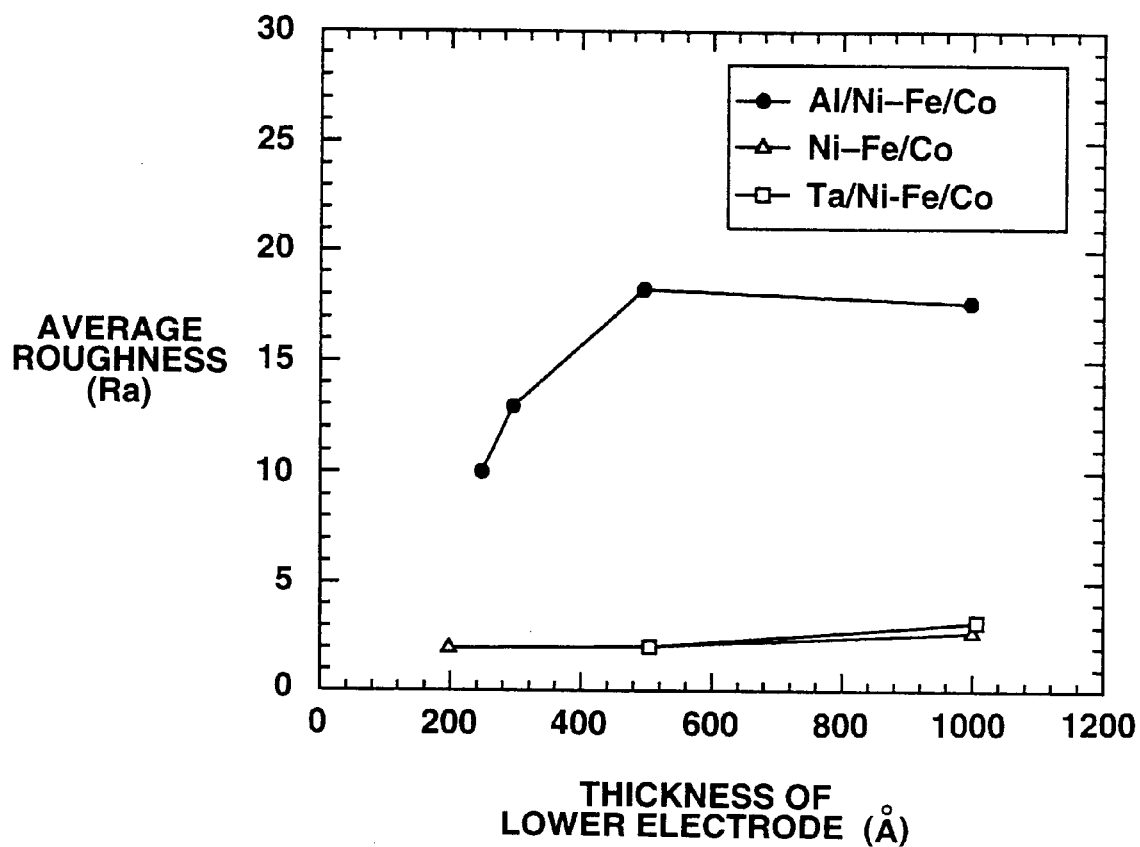
FIG. 5 is a graph showing the relation between the thickness of the first magnetic metal layer, inclusive of an underlying layer, and the average roughness of the first magnetic metal layer.

The measured results are shown in FIG. 5, from which it is seen that, if the Al underlying layer is provided for the first magnetic metal layer 3, the average roughness is increased with increase in the thickness of the Al underlying layer. Conversely, if there is no underlying layer or if there is the Ta underlying layer, the average roughness is scarcely changed with changes in thickness.

It is seen from this that, if Al is used as the underlying layer for the first magnetic metal layer 3, the average roughness of the first magnetic metal layer 3 can be decreased by reducing the thickness of the Al layer. By decreasing the thickness of the Al underlying layer to decrease the average roughness of the first magnetic metal layer 3, it is possible to increase the specific magnetoresistance of the magnetic tunnelling element.

For verification, measurement was made of the relation between the overall thickness and the specific magnetoresistance in case the thickness of the Co layer 2 is changed in the absence of the underlying layer, and in case the thickness of the Al underlying layer or the Ta underlying layer is changed. The measured results are shown in FIG. 6.

Figure 6:
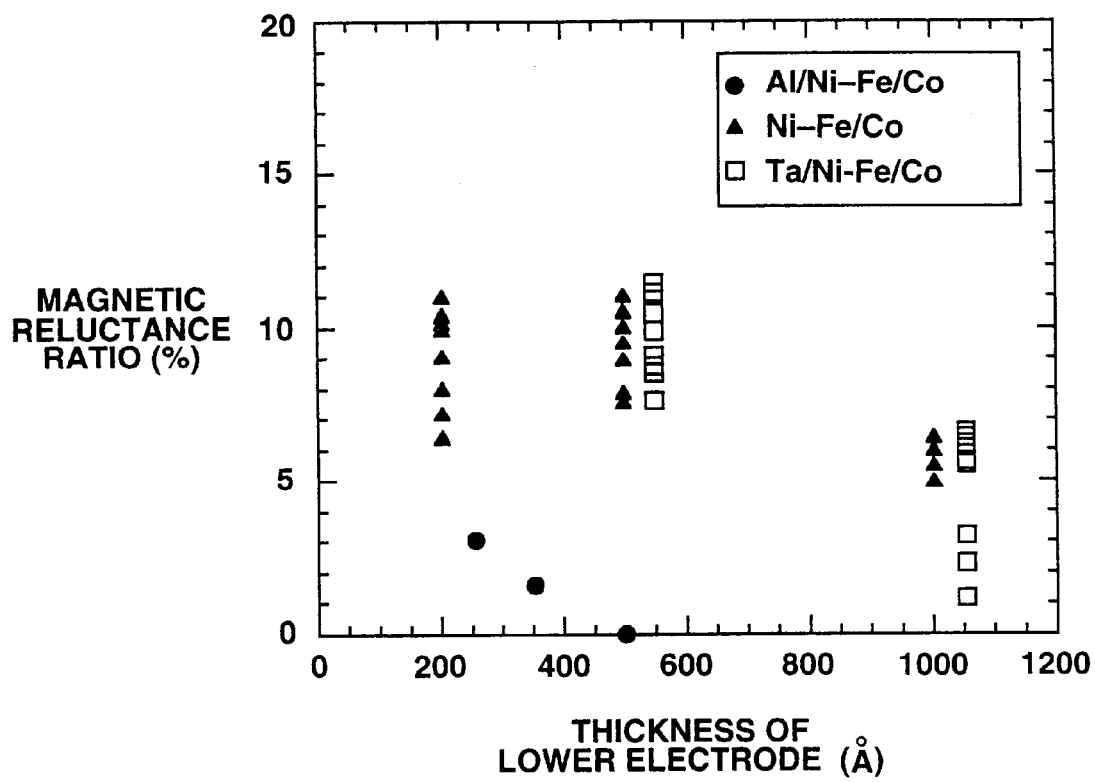
FIG. 6 is a graph showing the relation between the thickness of the first magnetic metal layer, inclusive of an underlying layer, and the specific magnetoresistance.

As may be seen from FIG. 6, in the presence of the Al underlying layer, the specific magnetoresistance tends to disappear with increased thickness of the Al underlying layer. If there is no underlying layer or if there is the Ta underlying layer, a predetermined specific magnetoresistance is displayed regardless of the overall thickness. It is seen from this that, in the presence of the Al underlying layer, the magnetic tunnelling element shows predetermined changes in the magnetoresistance by reducing the thickness of the Al layer.

While various embodiments of the present invention have been described, it will be apparent to those of ordinary skill in the art that many more embodiments and implementations are possible that are within the scoper of this invention. Accordingly, the invention is not to be restricted except in light of the attached claims and their equivalents.

What is claimed is:

1. A magnetic tunnelling element comprising:
   a first magnetic layer having a surface;
   a tunnel barrier layer formed on the surface of the first magnetic layer; and
   a second magnetic layer formed on the tunnel on the tunnel barrier layer, wherein
      the tunnel barrier layer has a tunnel current which flows between the first magnetic layer and the second magnetic layer when a potential is present across the first magnetic layer and the second magnetic layer; and the surface of the first magnetic layer carrying the tunnel barrier layer has a surface roughness (Ra) of 0.3 nm or less.

2. The magnetic tunnelling element according to claim 1, wherein the first magnetic layer is formed on a metal film serving as an electrode for the tunnel current.

3. The magnetic tunnelling element according to claim 2, wherein the first magnetic layer has transcribed thereon a surface shape of said metal film.

4. A method for manufacturing a magnetic tunnelling element at least including a first magnetic metal layer, a tunnel barrier layer and a second magnetic metal layer, laminated together, comprising the steps of:

forming the first magnetic layer to have a major surface with an average roughness (Ra) of 0.3 nm or less;

forming the tunnel barrier layer on the major surface of the first magnetic metal layer; and forming the second magnetic metal layer on the tunnel barrier layer.

5. The method for manufacturing a magnetic tunnelling element according to claim 4, wherein the first magnetic metal layer is formed by a high frequency inductive coupling RF plasma supporting magnetron sputtering method.

6. A magnetic head having a magnetic tunnelling element at least including a first magnetic layer having a surface, a tunnel barrier layer formed on the surface of the first magnetic layer and a second magnetic layer formed on the tunnel barrier layer, wherein the tunnel barrier layer has a tunnel current which flows between the first magnetic layer and the second magnetic layer when a potential is present across the first magnetic layer and the second magnetic layer; and the surface of the first magnetic layer carrying the tunnel barrier layer has a surface roughness (Ra) of 0.3 nm or less.

7. The magnetic tunnelling element according to claim 1, wherein the tunnel current remains constant when the potential across the first magnetic layer and the second magnetic layer is varied.

8. The magnetic tunnelling element according to claim 1, wherein the first magnetic layer has a magnetization with a direction that is free to change in the presence of an external magnetic field; and the second magnetic layer has a magnetization with a predetermined direction that is fixed in the presence of an external magnetic field.

9. The magnetic tunnelling element according to claim 8, wherein the first magnetic layer comprises a first magnetic sublayer and a second magnetic sublayer disposed on the first magnetic sublayer, the second magnetic sublayer forming the surface of the first magnetic layer.

10. The magnetic tunnelling element according to claim 9, wherein the second magnetic sublayer is formed to have a substantially higher spin polarization ratio than the first magnetic sublayer.

11. The magnetic tunnelling element according to claim 10, wherein the second magnetic sublayer comprises Cobalt and the first magnetic sublayer comprises NiFe.

12. The magnetic tunnelling element according to claim 8, wherein the second magnetic layer comprises a first magnetic sublayer formed on said tunnel barrier layer and a second magnetic sublayer formed on the first magnetic sublayer.

13. The magnetic tunnelling element according to claim 12, wherein the first magnetic sublayer is formed to have a substantially higher spin polarization ratio than the second magnetic sublayer.

14. The magnetic tunnelling element according to claim 13, wherein the first magnetic sublayer comprises Cobalt and the second magnetic sublayer comprises NiFe.

15. The method for manufacturing a magnetic tunnelling element according to claim 4, wherein the major surface of the first magnetic metal layer is formed to have an average roughness of 0.15 nm or less.

16. The method for manufacturing a magnetic tunnelling element according to claim 4, wherein the step of forming the first magnetic layer comprises the steps of:

forming a first magnetic sublayer;

forming a second magnetic sublayer that is disposed on the first magnetic sublayer and that forms the major surface of the first magnetic layer; and wherein the second magnetic sublayer is formed to have a substantially higher spin polarization ratio than the first magnetic sublayer.

17. The method for manufacturing a magnetic tunnelling element according to claim 16, wherein the first magnetic sublayer comprises NiFe and the second magnetic sublayer comprises Co.

18. The method for manufacturing a magnetic tunnelling element according to claim 4, wherein the step of forming the first magnetic layer comprises the steps of:

forming a first magnetic sublayer on the tunnel barrier layer; and forming a second magnetic sublayer disposed on the first magnetic sublayer wherein the first magnetic sublayer is formed to have a substantially higher spin polarization ratio than the second magnetic sublayer.

19. The method for manufacturing a magnetic tunnelling element according to claim 18, wherein the second magnetic sublayer comprises NiFe and the first magnetic sublayer comprises Co.

* * * * *